(12) United States Patent
Guo et al.

(10) Patent No.: US 10,001,507 B2
(45) Date of Patent: Jun. 19, 2018

(54) ICT PROBE CONTACT IMPROVEMENT

(71) Applicant: International Business Machines Corporation, Armonk, NY (US)

(72) Inventors: Wei Guo, Shenzhen (CN); Yanlong Hou, Shenzhen (CN); WeiFeng Zhang, Shenzhen (CN); Lin Zhao, Shenzhen (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 99 days.

(21) Appl. No.: 15/264,963

(22) Filed: Sep. 14, 2016

(65) Prior Publication Data

US 2018/0074094 A1    Mar. 15, 2018

(51) Int. Cl.
    *G01R 31/00*    (2006.01)
    *G01R 1/067*    (2006.01)
    *G01R 31/28*    (2006.01)

(52) U.S. Cl.
    CPC ...... *G01R 1/06711* (2013.01); *G01R 31/2801* (2013.01)

(58) Field of Classification Search
    CPC ....... H01L 2224/73265; H01L 2224/97; H01L 2224/73204; H01L 2224/16225; H01L 21/563; H01L 2224/81; H01L 2224/83; H01L 2224/9211; H01L 2924/07802; H01L 2224/73104; H01L 24/13; H01L 24/32; H01L 24/08; H01L 2924/14; H01L 31/0203; H01L 2224/12105; H01L 2224/16227; H01L 2224/73253; H01L 2224/81024; H01L 2224/81191; H01L 2224/81192; H01L 2224/81815;
    (Continued)

(56) References Cited

U.S. PATENT DOCUMENTS 2,510,942 A    6/1950  Albertson, Jr.
5,747,102 A *  5/1998  Smith .................... B05C 5/001
                                                    222/1
(Continued)

FOREIGN PATENT DOCUMENTS

CN    103983809 A    8/2014

OTHER PUBLICATIONS

McCalib, Jr., David, "Design Method of Modular Electronic Printed Circuit Board Testing System," Massachusetts Institute of Technology, Sep. 2013, 54 pages.

*Primary Examiner* — Vinh Nguyen
(74) *Attorney, Agent, or Firm* — Cantor Colburn LLP

(57) ABSTRACT

A method of testing a printed circuit board (PCB) with an in-circuit test (ICT) probe having an improved probe-to-via contact is provided. The ICT probe includes a tip attached to a spindle; a housing having a cavity, a portion of the spindle insertable into the cavity; and a heating element wrapped helically around the spindle, the heating element coupled to the housing. The probe is contacted with a surface of a flux layer of a test via of the PCB, said contact compressing the heating element and recessing the insertable portion of the spindle into the cavity. The tip of the probe is heated with the heating element to a temperature capable of at least partially melting the flux layer, the tip at least partially penetrating the flux layer to contact a surface of a solder plugging the test via.

20 Claims, 5 Drawing Sheets

(58) Field of Classification Search
CPC ... H01L 2224/8319; H01L 2224/83801; H01L 2224/29; H01L 2224/81801; H01L 33/62; G11B 2005/0021; G05B 11/01; F21K 9/232; F21K 9/235; F21K 9/237; F21K 9/238; F21K 9/90; G01R 31/2635; G01R 31/2642; H01B 1/22; H01R 13/73
See application file for complete search history.

(56) References Cited

U.S. PATENT DOCUMENTS

| | | |
|---|---|---|
| 7,259,576 B2 * | 8/2007 | Parker ................ G01R 1/06722 324/755.05 |
| 7,461,171 B2 | 12/2008 | Thurner |
| 2005/0184028 A1 | 8/2005 | Baur et al. |
| 2011/0025429 A1 | 2/2011 | Syal |
| 2014/0229783 A1 | 8/2014 | Qin et al. |
| 2015/0109012 A1 | 4/2015 | Yang et al. |

* cited by examiner

ICT PROBE CONTACT IMPROVEMENT

BACKGROUND

The present invention relates in general to printed circuit board (PCB) in-circuit test (ICT) methods and structures. More specifically, the present invention relates to ICT probe structures having an improved probe-to-via contact and methods of using the same.

Circuit boards such as multilayer printed circuit boards (PCBs) are widely used in the electronics industry. PCBs typically include one or more layers having conductive traces etched onto them, the various layers separated by a dielectric material. Interconnections are possible between each layer, for example using through-holes or vias. PCB design and production is often subject to various, often conflicting, requirements, such as a demand for products which are compact, operate at high-speeds, have low costs, and have high reliability. Meeting these requirements presents an ongoing challenge for the industry.

In-circuit tests (ICTs) are widely used throughout the industry to improve PCB reliability and quality control. ICTs assess the electrical properties of electrical elements in PCBs and the quality of the electrical connections between the electrical elements. ICTs measure the resistances, capacities, and other characteristics of each electrical element to detect potential manufacturing defects and the reliability of each electrical element tested. For example, an ICT can identify open or short circuits. ICTs offer simple operation requirements and accurate defect positioning.

SUMMARY

According to embodiments of the present invention, a method of fabricating an ICT probe having an improved probe-to-via contact is provided. The method can include providing an ICT probe having a tip attached to a spindle; a housing having a cavity, a portion of the spindle insertable into the cavity; and a heating element wrapped helically around the spindle, the heating element coupled to the housing. The probe is contacted with a surface of a flux layer of a test via of the PCB, said contact compressing the heating element and recessing the insertable portion of the spindle into the cavity. The tip of the probe is heated with the heating element to a temperature capable of at least partially melting the flux layer, the tip at least partially penetrating the flux layer to contact a surface of a solder plugging the test via.

According to embodiments of the present invention, a PCB ICT probe having an improved probe-to-via contact is provided. The probe can include a tip attached to a spindle; a housing having a cavity, a portion of the spindle insertable into the cavity; and a heating element wrapped helically around the spindle, the heating element coupled to the housing. Contacting a surface of a flux layer of a test via of the PCB with the probe compresses the heating element and recesses the insertable portion of the spindle into the cavity. The heating element is capable of heating the tip of the probe to a temperature capable of at least partially melting the flux layer.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
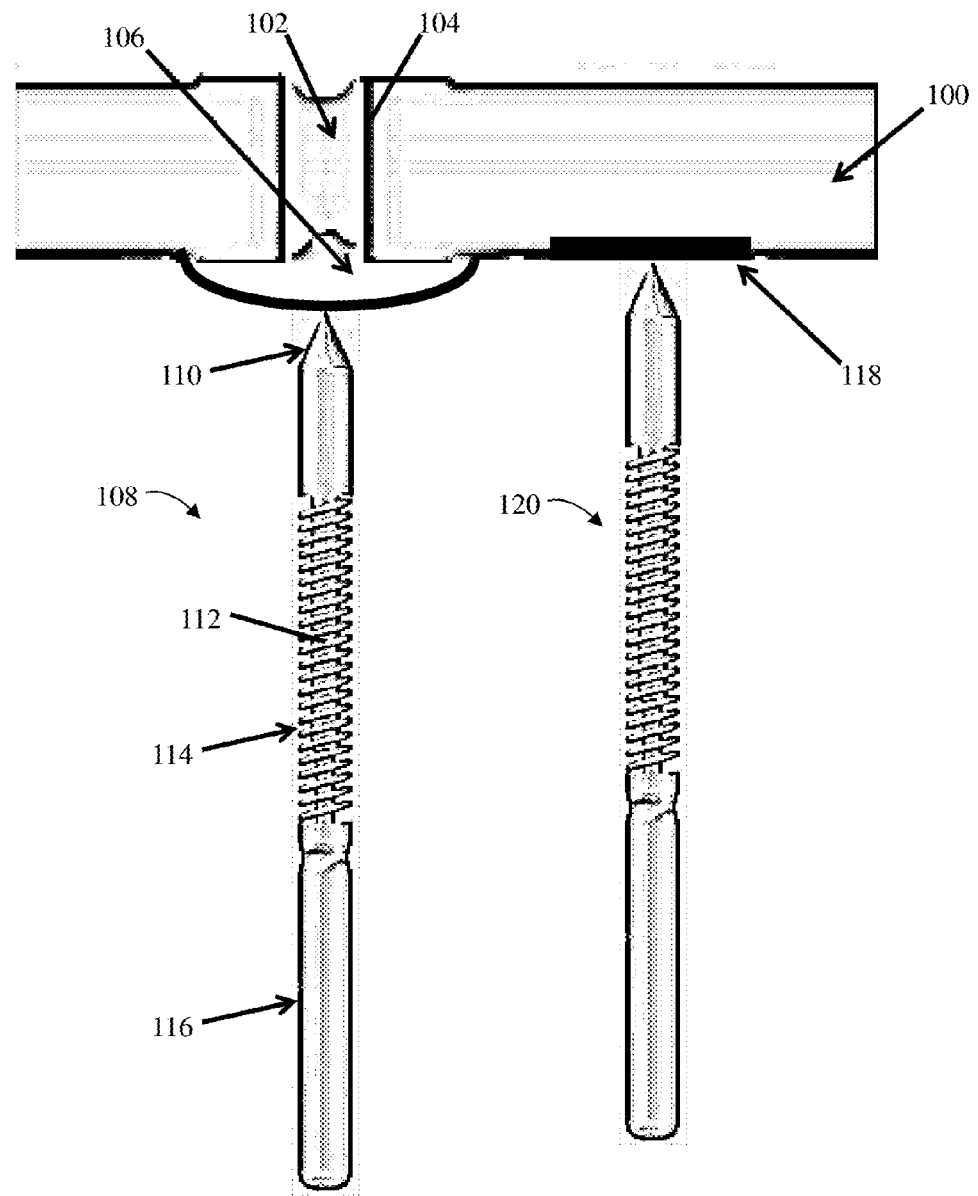
FIG. 1 depicts a cross-sectional view of a PCB having a solder plugging a test via during an intermediate step of an ICT according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to a layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "about" is intended to include the degree of error associated with measurement of the particular quantity based upon the equipment available at the time of filing the application. For example, "about" can include a range of ±8% or 5%, or 2% of a given value.

For the sake of brevity, conventional techniques related to ICTs of PCBs may or may not be described in detail herein. Moreover, the various tasks and process steps described herein can be incorporated into a more comprehensive procedure or process having additional steps or functionality not described in detail herein. In particular, various steps in the manufacture of ICT probes and PCBs are well known and so, in the interest of brevity, many conventional steps will only be mentioned briefly herein or will be omitted entirely without providing the well-known process details.

Turning now to a more detailed description of technologies relevant to the present invention, as previously noted herein, there are challenges to providing PCBs which are compact, operate at high-speeds, have low costs, and have high reliability. ICTs provide PCB quality control by testing the reliability of the PCB electrical elements and connections. ICTs rely upon a plurality of ICT probes positioned over each element and connection to be tested. For example, an ICT probe can be positioned over a test via. An accurate reliability test of the test via requires a firm contact between the ICT probe and the test via. Providing a reliable contact can be problematic, especially for test vias on PCBs treated with organic solderability preservative (OSP). OSP is a water-based organic compound introduced during the PCB fabrication process to selectively bond with and protect the PCB copper until soldering is applied in a later fabrication step to plug the test via. Unfortunately, the elevated reflow soldering temperatures required in lead-free soldering processes cause oxidation on the OSP coating. Consequently, a thin flux layer forms over the solder plugging the test via. The flux layer typically cools to room temperature prior to the ICT, becoming hard and sticky. The cooled flux layer reduces the quality of the contact between the ICT probe and the test via. Moreover, continuous testing of OSP-treated PCBs causes a buildup of flux to accumulate on the ICT probe tips. The flux buildup can further impede the probe-to-via contact.

The flux layer formed over the test via and the flux buildup on the ICT probe causes a high no defect found (NDF) rate during ICTs. The NDF rate indicates the frequency that a re-test of a failed test element (e.g., an electrical element or connection having a suspected defect) does not confirm the defect. For example, a 50% NDF rate for test vias indicates that half of the test vias which initially fail an ICT reliability test will pass when re-tested. A high NDF rate can indicate a poor contact between an ICT probe and a test element and substantially reduces the ICT efficiency. Known solutions to these flux problems are somewhat limited. For example, special test probe tips having a high spring force can improve probe-to-via contact, the cleaning frequency of each ICT probe during maintenance can be increased to remove flux build up from the probe tips, and the number of times the ICT probe actuates each PCB element (e.g., a test via) can be increased. These solutions increase the ICT cost, do not adequately address the flux layer formed over the test via, or fail to sufficiently decrease the NDF rate. Thus, a method and structure are desired for an ICT probe having an improved probe-to-via contact and reduced NDF rate.

Turning now to an overview of aspects of the present invention, one or more embodiments provide methods of fabricating an ICT probe and ICT probe structures having an improved probe-to-via contact. The described methods and structures employ a spring-based heating element. The spring-based heating element serves a dual purpose: first, heating the tip of the ICT probe to a temperature hot enough to soften and penetrate a flux layer on a test via; and second, providing a flexible connection to the ICT probe tip to improve the quality of the probe contact to the test via. The temperature of the ICT probe tip is controlled to remain below the solder melt point. In this manner, an ICT probe having an improved probe-to-via contact, a reduced NDF rate, and a reduced tip maintenance requirement is provided. The improved ICT probe is easily integrated into existing ICT systems, increasing ICT efficiency. Methods for fabricating an ICT probe and the resulting structures therefrom in accordance with embodiments of the present invention are described in detail below by referring to the accompanying drawings in FIGS. 1-5.

FIG. 1 illustrates a cross-sectional view of a PCB 100 having a solder 102 plugging a test via 104 (sometimes referred to as "filling" a test via) during an intermediate step of an ICT according to one or more embodiments. Any known composition and manner of forming the PCB 100 can be utilized. In some embodiments, the PCB 100 can be a multilayer PCB and can be fully assembled (e.g., with capacitors, resistors, and other board elements). A fully assembled PCB is commonly referred to as a PCB assembly (PCBA). In some embodiments, the PCB 100 can include an OSP coating (not illustrated). The solder 102 can be of any suitable PCB solder material, such as, for example, a lead free solder material including tin, copper, silver, bismuth, indium, zinc, antimony, traces of other metals, and alloys thereof. The solder 102 can have a melting point, for example, of about 217 degrees Celsius. In some embodiments, the solder 102 is a high temperature application solder having a melting point of greater than about 400 degrees Celsius. In some embodiments, a flux layer 106 is formed as a bi-product of the soldering process over the solder 102 and portions of the PCB 100. Consequently, the composition of the flux layer 106 depends in part upon the chosen solder material. In some embodiments, the flux layer 106 can be succinic acid, glutaric acid, adipic acid, ethylenediaminetetraacetic acid (EDTA), abietic acid, pimaric acid, and leviopimaric acid. Tables 1A and 1B illustrate a variety of possible flux compositions, associated chemical formula and structure, and melting points.

TABLE 1A

Selected Flux Compositions and Associated Melting Points

| Flux | Chemical Formula | Chemical Structure | Melt Point C |
|---|---|---|---|
| Succinic Acid | (HOOC)(CH$_2$)$_2$(COOH) | 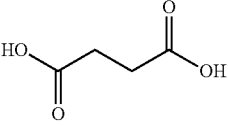 | 184 |
| Glutaric Acid | (HOOC)(CH$_2$)$_3$(COOH) | 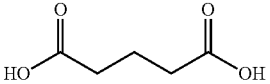 | 95-98 |
| Adipic Acid | (HOOC)(CH$_2$)$_4$(COOH) | 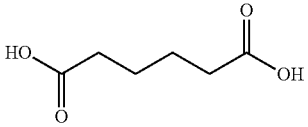 | 152 |
| EDTA | (HOOCCH$_2$)$_2$NCHCHN(CH$_2$COOH)$_2$ | 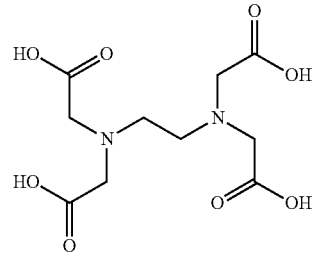 [SMILES: O=C(O)CN(CCN(CC(=O)O)CC(=O)O)CC(=O)O] | 237 |

TABLE 1B

Additional Flux Compositions and Associated Melting Points

| Flux | Chemical Formula | Chemical Structure | Melt Point C |
|---|---|---|---|
| Abietic Acid | C$_{19}$H$_{29}$COOH | 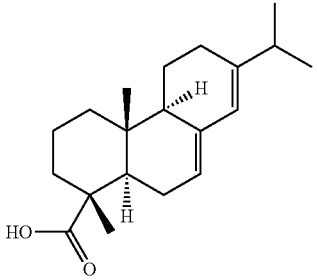 | 140 or 173 |
| Pimaric Acid | C$_{20}$H$_{30}$O$_2$ | 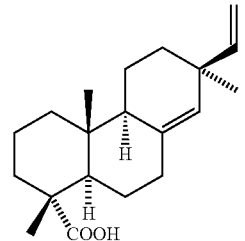 | 217-219 |

TABLE 1B-continued

Additional Flux Compositions and Associated Melting Points

| Flux | Chemical Formula | Chemical Structure | Melt Point C |
|---|---|---|---|
| Leviopimarc Acid | $C_{20}H_{30}O_2$ | 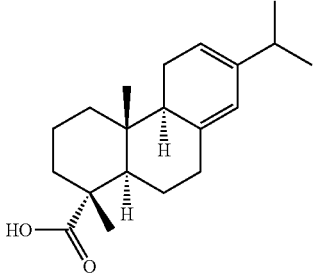 | 150 |

An ICT probe 108 having a tip 110 attached to a spindle 112, a spring-based heating element 114 wrapped helically around the spindle 112, and a housing 116 having a cavity contacts a surface of the flux layer 106. The spring-based heating element 114 is coupled to the housing 116. The cavity is sized such that a portion of the spindle 112 is insertable into the cavity of the housing 116. In some embodiments, the spindle 112 includes a first diameter. A diameter of the cavity is slightly larger than the first diameter of the spindle 112. By applying a force to the tip 110 (i.e., by pressing the tip 110 against the surface of the flux layer 106), the spring-based heating element 114 is compressed and a portion of the spindle 112 is recessed into the cavity of the housing 116. In some embodiments, the tip 110 is a high string force tip. Any known high string force tip can be utilized.

Figure 4:
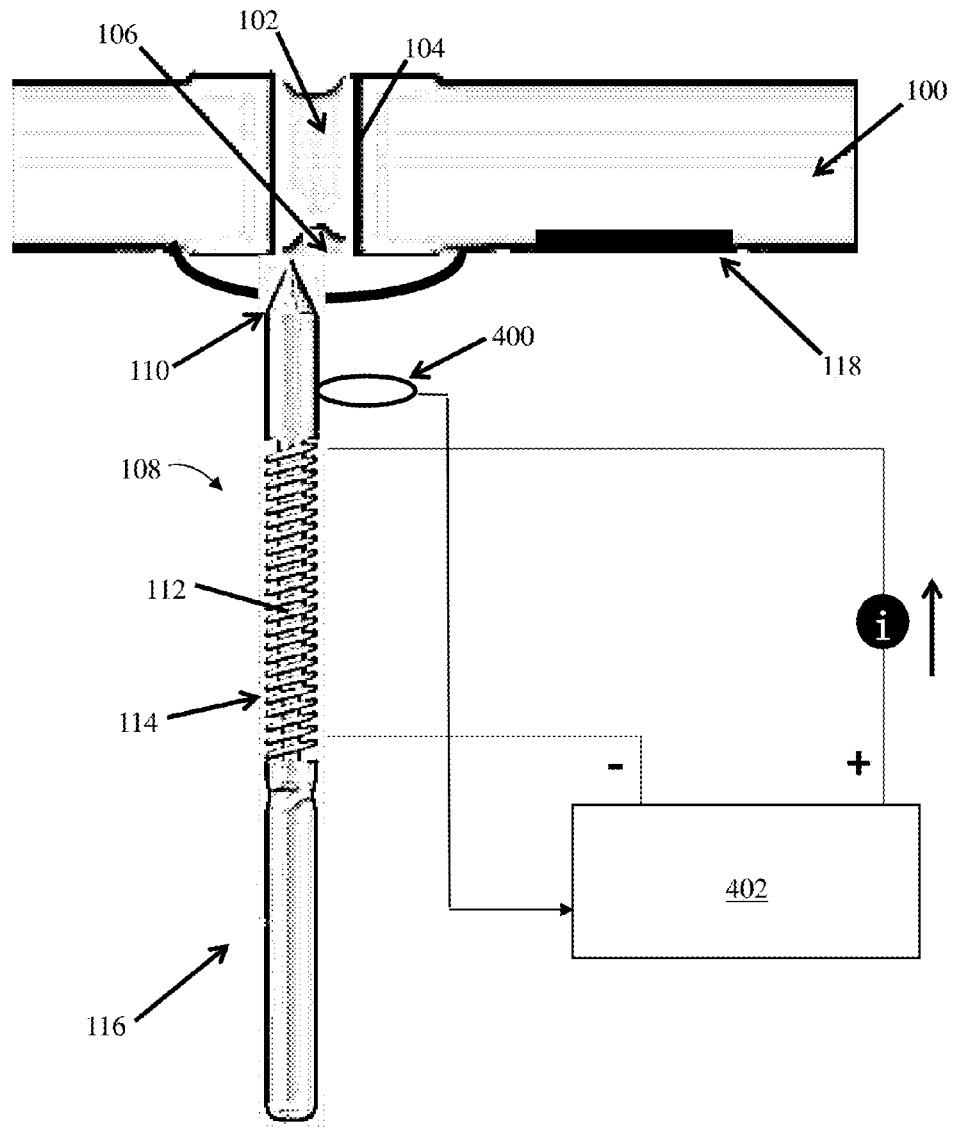
FIG. 4 depicts a cross-sectional view of the PCB during an intermediate step of an ICT according to one or more embodiments of the present invention.

The tip 110 is heated by the spring-based heating element 114 to a temperature capable of at least partially melting the flux layer 106. Partially melting the flux layer 106 allows for the tip 110 to at least partially penetrate the surface of the flux layer 106 to contact a surface of the solder 102 plugging the test via 104. In some embodiments, a current is passed through the spring-based heating element 114 to heat the tip 110 (as depicted in FIG. 4).

In some embodiments, a test pad 118 of the PCB 100 is contacted by a reference probe 120. The reference probe 120 (sometimes referred to as a "ground" or "power" probe) is formed in a like manner as is the ICT probe 108. Contacting the reference probe 120 to the test pad 118 completes a circuit including the ICT probe 108 and the PCB 100 during the ICT.

Figure 2:
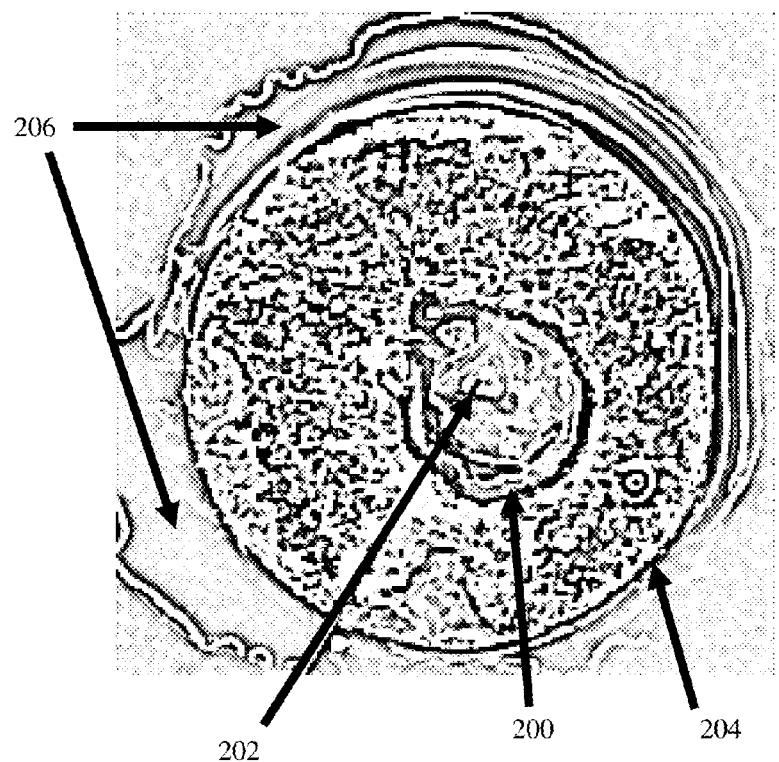
FIG. 2 depicts a cross-sectional view of a surface of a test via having a probe mark during an intermediate step of an ICT according to one or more embodiments of the present invention.

FIG. 2 illustrates a cross-sectional view of a surface of a test via 200 having a probe mark 202 during an intermediate step of an ICT according to one or more embodiments. The probe mark 202 indicates that a probe (not illustrated) successfully contacted a surface of the test via 200. The test via 200 is plugged with a solder 204. In some embodiments, the solder 204 is tin. In some embodiments, the solder 204 is a lead free solder material including tin, copper, silver, bismuth, indium, zinc, antimony, traces of other metals, and alloys thereof. A flux layer 206 overlaps the test via 200 and the solder 204. As discussed previously herein, the flux layer 206 is formed as a bi-product of the soldering process. In some embodiments, the flux layer 206 spreads and flows non-uniformly across the surface of the test via 200 and the solder 204.

Figure 3:
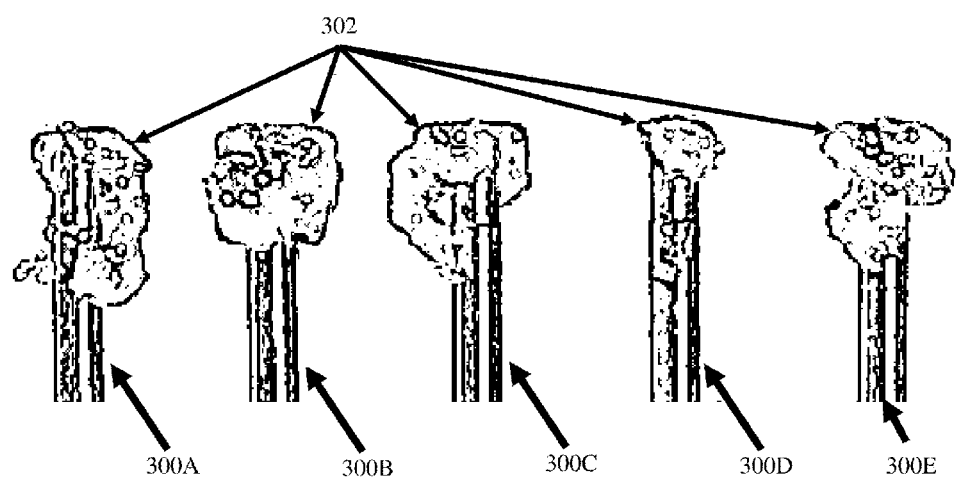
FIG. 3 depicts a side view of a plurality of test probe tips according to one or more embodiments of the present invention.

FIG. 3 illustrates a side view of a plurality of test probe tips 300A-300E. Each tip is covered by a non-uniform build-up of flux 302. As discussed previously herein, continuous testing of OSP-treated PCBs causes a buildup of flux to accumulate on ICT probe tips. The flux buildup can impede the probe-to-via contact during an ICT.

FIG. 4 illustrates a cross-sectional view of the PCB 100 during an intermediate step of an ICT according to one or more embodiments. The ICT probe 108 is coupled to a temperature sensor 400. A temperature controller 402 is electrically coupled to the temperature sensor 400 and to the spring-based heating element 114. In some embodiments, the temperature controller 402 is a proportional-integral-derivative (PID) controller. The temperature controller 402 regulates a current passing through the spring-based heating element 114. The current can be increased to increase the temperature of the spring-based heating element 114. Similarly, the current can be decreased to decrease the temperature of the spring-based heating element 114. The tip 110 is conductively heated by the spring-based heating element 114.

In this configuration, the temperature of the tip 110 can be indirectly controlled by the temperature controller 402 by regulating the current passing through the spring-based heating element 114. The temperature controller 402 ensures that the temperature of the tip 110 is high enough to at least partially melt the flux layer 106 while simultaneously limiting the temperature of the tip 110 to a temperature lower than a melting point of the solder 102. In this manner, the tip 110 can at least partially penetrate the flux layer 106 to contact a surface of the solder 102 without damaging or otherwise compromising the solder 102. Consequently, the probe-to-via contact between the ICT probe 108 and the test via 104 (plugged by the solder 102) is improved and the NDF rate is correspondingly decreased. In some embodiments, the temperature controller 402 is manually adjustable by a user. In some embodiments, the temperature controller 402 automatically adjusts the current passing through the spring-based heating element in real-time.

Figure 5:
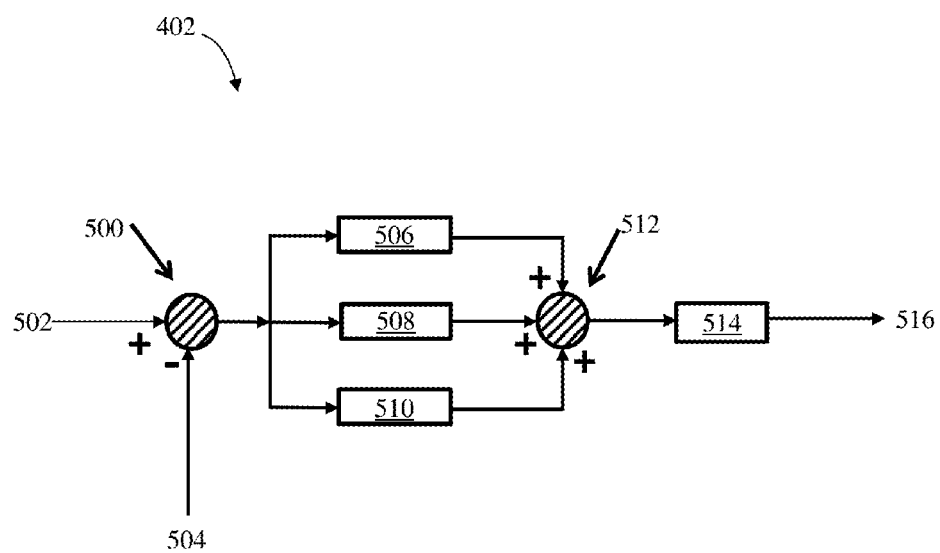
FIG. 5 depicts a block diagram of a temperature controller according to one or more embodiments of the present invention.

FIG. 5 illustrates a block diagram of the temperature controller 402 according to one or more embodiments. The temperature controller 402 can be a known proportional-integral-derivative (PID) controller. A PID controller uses a feedback control loop to minimize a calculated error value defined as a difference between a desired set point (e.g., a desired probe tip temperature) and a measured process variable (e.g., the actual temperature as measured in real-time). An adder 500 processes a temperature set value 502 and a feedback signal 504 (e.g., the current temperature as measured by the temperature sensor 400 in real-time) to calculate an error value by determining the difference between the temperature set value 502 and the feedback signal 504. The output signal of the adder 500 is received by the proportional processor 506, the integral processor 508, and the derivative processor 510. In some embodiments, the proportional processor 506 accounts for present values of the error value, the integral processor 508 accounts for past values of the error value, and the derivative processor 510 accounts for an expected future value of the error value as a function of the current rate of change in the error value. The output signal from each of the processors 506, 508, and 510 are combined by an adder 512 and received by a current control processor 514. The current control processor 514 attempts to minimize the calculated error value by adjusting the current passing through the spring-based heating element 114 via current control 516.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for in-circuit testing a printed circuit board (PCB), the method comprising:
    providing a probe comprising:
        a tip attached to a spindle;
        a housing having a cavity, a portion of the spindle insertable into the cavity;
        a heating element wrapped helically around the spindle, the heating element coupled to the housing;
    contacting a surface of a flux layer of a test via of the PCB with the probe, said contact compressing the heating element and recessing the insertable portion of the spindle into the cavity; and
    heating the tip of the probe with the heating element to a temperature capable of at least partially melting the flux layer, the tip at least partially penetrating the flux layer to contact a surface of a solder plugging the test via.

2. The method of claim 1, wherein heating the tip of the probe further comprises passing a current through the heating element.

3. The method of claim 2, further comprising controlling the current through the heating element such that the temperature of the tip is lower than a melting point of the solder.

4. The method of claim 3, wherein controlling the current further comprises:
    coupling the heating element to a temperature sensor; and
    electrically coupling the temperature sensor to a proportional-integral-derivative (PID) controller.

5. The method of claim 1, wherein the PCB is a multilayer PCB.

6. The method of claim 1, wherein the PCB is fully assembled.

7. The method of claim 1, wherein the PCB is coated with an organic solderability preservative (OSP).

8. The method of claim 1, wherein a material of the solder is selected from the group consisting of tin, copper, silver, bismuth, indium, zinc, antimony, and alloys thereof.

9. The method of claim 1, wherein a material of the flux layer is selected from the group consisting of succinic acid, glutaric acid, adipic acid, ethylenediaminetetraacetic acid (EDTA), abietic acid, pimaric acid, and leviopimaric acid.

10. The method of claim 1, further comprising contacting a test pad of the PCB with a reference probe.

11. A printed circuit board (PCB) in-circuit test (ICT) probe comprising:
    a tip attached to a spindle;
    a housing having a cavity, a portion of the spindle insertable into the cavity; and
    a heating element wrapped helically around the spindle, the heating element coupled to the housing;
    wherein contacting a surface of a flux layer of a test via of the PCB with the probe compresses the heating element and recesses the insertable portion of the spindle into the cavity;
    wherein the heating element is capable of heating the tip of the probe to a temperature capable of at least partially melting the flux layer.

12. The probe of claim 11, further comprising:
    a temperature sensor coupled to the tip; and
    a heating controller electrically coupled to the temperature sensor, said heating controller regulating a current through the heating element.

13. The probe of claim 12, wherein the heating controller regulates the current through the heating element such that the temperature of the tip is lower than a melting point of a solder plugging the test via.

14. The probe of claim 13, wherein the heating controller comprises a proportional-integral-derivative (PID) controller.

15. The probe of claim 11, wherein the PCB is a multilayer PCB.

16. The probe of claim 11, wherein the PCB is fully assembled.

17. The probe of claim 11, wherein the PCB is coated with an organic solderability preservative (OSP).

18. The probe of claim 13, wherein a material of the solder is selected from the group consisting of tin, copper, silver, bismuth, indium, zinc, antimony, and alloys thereof.

19. The probe of claim 11, wherein a material of the flux layer is selected from the group consisting of succinic acid, glutaric acid, adipic acid, ethylenediaminetetraacetic acid (EDTA), abietic acid, pimaric acid, and leviopimaric acid.

20. The probe of claim 11, wherein the tip is a high string force tip.

* * * * *